(12) United States Patent
Mishra et al.

(10) Patent No.: US 12,541,218 B2
(45) Date of Patent: Feb. 3, 2026

(54) CIRCUIT WITH SOI TRANSISTORS FOR PROVIDING A CTAT CURRENT

(71) Applicant: NXP B.V., Eindhoven (NL)

(72) Inventors: Anjani Kumar Mishra, Faridabad (IN); Charan Hemanth Kumar, Bangalore (IN); Achal Venkatesh, Bangalore (IN)

(73) Assignee: NXP B.V., Eindhoven (NL)

( * ) Notice: Subject to any disclaimer, the term of this patent is extended or adjusted under 35 U.S.C. 154(b) by 31 days.

(21) Appl. No.: 18/785,532

(22) Filed: Jul. 26, 2024

(65) Prior Publication Data

US 2025/0328159 A1    Oct. 23, 2025

(30) Foreign Application Priority Data

Apr. 19, 2024    (IN) .............................. 202441031501

(51) Int. Cl.
*G05F 3/26* (2006.01)
*H10D 86/00* (2025.01)

(52) U.S. Cl.
CPC ........... *G05F 3/262* (2013.01); *H10D 86/201* (2025.01)

(58) Field of Classification Search
CPC ...................................... G05F 3/262
USPC ........................................ 327/543
See application file for complete search history.

(56) References Cited

U.S. PATENT DOCUMENTS 10,037,047 B2 *  7/2018  Quelen .................. G05F 3/267
2017/0153659 A1   6/2017  Quelen

OTHER PUBLICATIONS

Jacquemod, G., "New design of analog and mixed-signal cells using back-gate cross-coupled structure", 2019 IFIP/IEEE 27th International Conference on Very Large Scale Integration (VLSI-SoC), DOI: 10.1109/VLSI-SoC.2019.8920390, Oct. 6-9, 2019.
Wei, Z., "Novel Building Blocks for PLL Using Complementary Logic in 28nm UTBB-FDSOI Technology", 2017 15th IEEE International New Circuits and Systems Conference (NEWCAS), DOI: 10.1109/NEWCAS.2017.8010120, Jun. 25-28, 2017.
Filanovsky, I.M., "Mutual Compensation of Mobility and Threshold Voltage Temperature Effects with Applications in CMOS Circuits", IEEE Transactions on Circuits and Systems—I: Fundamental Theory and Applications, vol. 48, No. 7, Jul. 2001.
Zhou, Z., "A CMOS Voltage Reference Based on Mutual Compensation of Vtn and Vtp", IEEE Transactions on Circuits and Systems—II: Express Briefs, vol. 59, No. 6, Jun. 2012.

* cited by examiner

*Primary Examiner* — Tomi Skibinski
(74) *Attorney, Agent, or Firm* — David G. Dolezal

(57) ABSTRACT

A CTAT circuit that generates a CTAT current. The circuit includes two SOI transistors of a first conductivity type arranged in a current mirror configuration where the gates of the two transistors and the back gate contact of one of the transistors is connected to the drain of the other transistor. The SOI transistor of the first conductivity type whose back gate contact is connected to the drain of the other SOI transistor of the first conductivity type is located in current path that carries a CTAT current. In some embodiments, the drains of the two transistors are each coupled to a drain of a respective one of a second pair of SOI transistors of a second conductivity type, where the second pair of SOI transistors are also configured in a current mirror configuration.

20 Claims, 5 Drawing Sheets

CIRCUIT WITH SOI TRANSISTORS FOR PROVIDING A CTAT CURRENT

CROSS-REFERENCE TO RELATED APPLICATIONS

This application claims the priority under 35 U.S.C. § 119 of India application no. 202441031501, filed on 19 Apr. 2024, the contents of which are incorporated by reference herein.

BACKGROUND OF THE INVENTION

Field of the Invention

This invention relates to a circuit for generating a CTAT current.

Background

FIG. 1 is a circuit diagram of a prior art reference current circuit 101 that provides a reference current (I) to oscillator 103. Circuit 101 includes three resistors 105, 107, and 109 coupled in series in a current path with an NFET transistor 113. One terminal of resistor 105 is connected to a reference voltage terminal VREF. The back gate contacts of NFETs 113, 115, and 117 are connected to a node located between resistors 107 and 109. The sources of NFETs 113 and 115 are connected to one terminal of resistor 111 and the other terminal of resistor 111 is connected to supply voltage terminal (BULK VSS) that is also used to bias the underlying bulk semiconductor material of a semiconductor on insulator (SOI) substrate of the integrated circuit implementing circuit 101. NFET 113 and NFET 115 are configured in a current mirror configuration where the gates of NFET 113 and NFET 115 are connected together and connected to the drain of NFET 113 and the sources of NFET 113 and NFET 115 are connected together.

NFET 115 is located in a current path that includes enabling NFET 117, resistor 121, PFET 121, and resistor 123. NFET 117 becomes conductive when the enable signal (EN) is asserted. PFET 121 and PFET 129 are in a current mirror configuration where the gates of PFETs 121 and 129 are connected to the drain of PFET 121. The sources of PFET 121 and PFET 129 are coupled to a supply voltage terminal VDD through resistors 123 and 127, respectively. Circuit 101 includes a disabling PFET 125 that becomes conductive to disable circuit 101 when the enable signal (EN) is non asserted. The back gate contacts of PFETs 121, 125, and 129 are connected to supply voltage terminal VDD.

NFETs 113, 115, and 117 and PFETs 121, 125, and 129 are implemented with fully depleted, semiconductor on insulator (FDSOI) field effect transistors (FETs). The channel regions of these transistors are located in a semiconductor layer that is located on a buried oxide layer which is located on a bulk semiconductor layer of an integrated circuit. The channel regions are typically undoped.

During operation, current from the VREF terminal flows through the current path of NFET 113 where the current is mirrored through the current path of NFET 115 and PFET 121. Based upon the proper sizing of the resistances of resistors 105, 107, and 109, the current flowing through the current path of NFET 113 is relatively constant over temperature, provided that VREF is relatively constant over temperature. The current through the current path of NFET 115 and PFET 121 is then mirrored through PFET 129 to produce reference current (I) that is provided to oscillator 103. The back gate contacts of NFETs 113, 115, and 117 being connected to a node between resistors 107 and 109 biases the body of NFETs 113, 115, and 117 at a higher voltage to adjust the threshold voltage of NFETs 113, 115, and 117 during operation.

One issue with circuit 101 is that it requires a relatively constant reference voltage (VREF) and relatively precise resistors 105, 107 and, 109 to provide a relatively constant reference current (I) over temperature.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclose herein, a CTAT circuit that generates a CTAT current. The circuit includes two SOI transistors of a first conductivity type arranged in a current mirror configuration where the gates of the two transistors and the back gate contact of one of the transistors is connected to the drain of the other transistor. The SOI transistor of the first conductivity type whose back gate contact is connected to the drain of the other SOI transistor of the first conductivity type is located in current path that carries a CTAT current. In some embodiments, the drains of the two transistors are each coupled to a drain of a respective one of a second pair of SOI transistors of a second conductivity type, where the second pair of SOI transistors are also configured in a current mirror configuration.

One advantage that may occur in some embodiments of the above described CTAT circuit is that the back gate contact voltage of the one SOI transistor can be self-biased and provides relatively linear CTAT current over a relatively wide range of temperatures. Accordingly, such a CTAT current can be utilized with a PTAT current to produce a reference current or a reference voltage that is relatively flat over a wide temperature range.

It is desirable in some circuits to have a reference voltage or a reference current that is relatively constant over a wide temperature range. One issue in generating such a voltage or current is that that the operation of some semiconductor devices vary over temperature.

Some reference circuits utilize bipolar devices. However, bipolar devices utilize more area than MOS devices such as NFETs and PFETs. Furthermore, BJTs inherently have junction leakages because of parasitic diodes which affect accuracy.

Some MOS device based reference circuits can be implemented with selective threshold voltage altering techniques such as selective channel implants and work-function alternating gate and gate dielectric materials for selective transistors. However, these techniques typically required extra mask steps thereby increasing the cost and complexity of manufacturing an integrated circuit.

Figure 1:
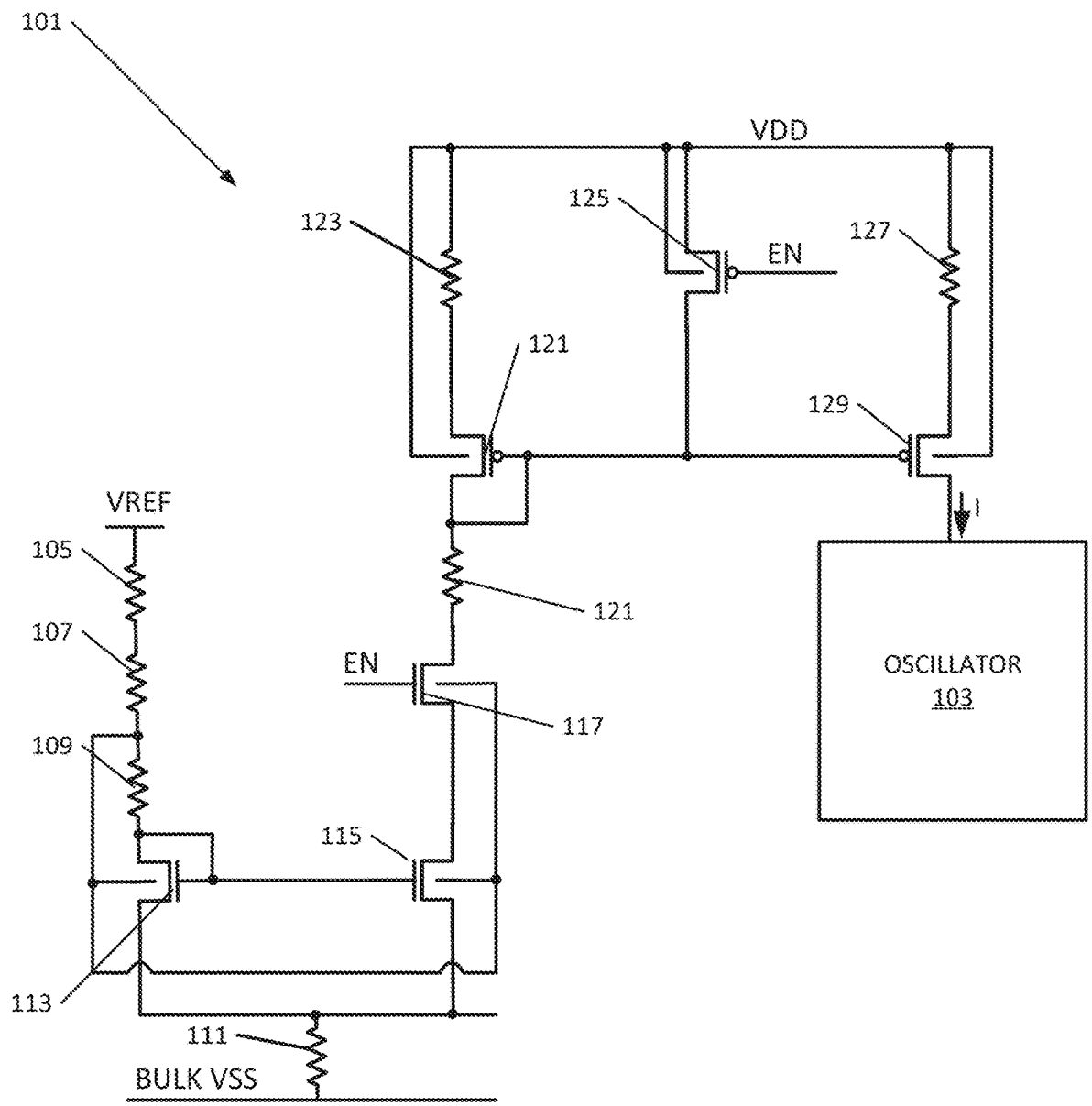
FIG. 1 is a circuit diagram of a prior art reference current circuit.
Figure 2:
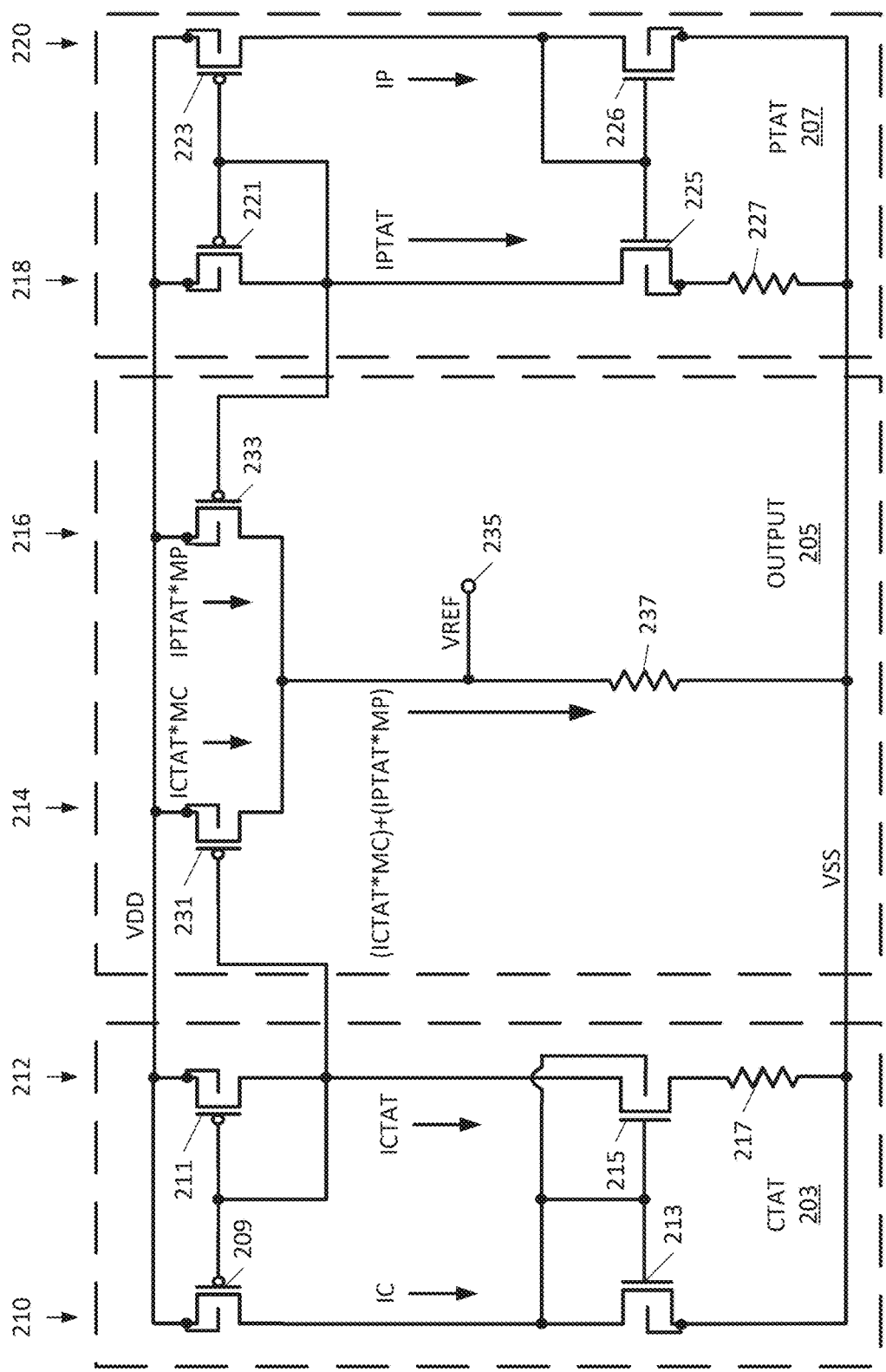
FIG. 2 is a reference voltage generator circuit according to one embodiment of the present invention.

FIG. 2 is a circuit diagram of a reference voltage generator circuit 201 that generates a reference voltage VREF at output node 235 that is relatively constant over a wide temperature range. Circuit 201 includes a CTAT circuit 203 that generates a CTAT (complementary to absolute temperature) current (ICTAT). A CTAT current is a current that varies inversely (complementary) with respect to a change in temperature. Circuit 201 includes a PTAT circuit that generates a PTAT (proportional to absolute temperature) current (IPTAT). A PTAT current is a current that varies proportionally with a change in temperature. Circuit 201 includes an output circuit 205 that generates the reference voltage VREF at node 235 where the reference voltage VREF is dependent upon both ICTAT and IPTAT.

CTAT circuit 203 includes NFET 213 and NFET 215 configured in a current mirror configuration where the gates of NFETs 213 and 215 are connected to the drain of NFET 213. NFETs 213 and 215 are SOI transistors where their sources, drains and channel regions are located above a buried dielectric layer. See the of FIG. 5 as an example. The back gate contact of NFET 213 is connected to the source of NFET 213, and the back gate contact of NFET 215 is connected to the drain of NFET 213 to bias the back gate at a non-zero voltage. The source of NFET 213 is connected to supply voltage terminal VSS. The source of NFET 215 is connected to a terminal of resistor 217. The other terminal of resistor 217 is connected to supply voltage terminal VSS. The drain of NFET 213 is connected to the drain of PFET 209, and the drain of NFET 215 is connected to the drain of PFET 211. PFET 209 and PFET 211 are configured in current mirror configuration with their gates being connected to the drain of PFET 211. In some embodiments, the mirror ratio of the current mirror of PFETs 209 and 211 is 1:1, but may be of other ratios in other embodiments The sources and back gate contacts of PFETs 209 and 211 are connected to supply voltage terminal VDD.

PTAT circuit 207 includes NFET 225 and NFET 226 configured in a current mirror configuration where the gates of NFET 225 and NFET 226 are connected to the drain of NFET 226. The source and back gate contact of NFET 225 are connected to a terminal of resistor 227, and the other terminal of resistor 227 is connected to the supply voltage terminal VSS. The source and back gate contact of NFET 226 are connected to supply voltage terminal VSS. The drain of NFET 226 is connected to the drain of PFET 223, and the drain of NFET 225 is connected to drain of PFET 221. PFETs 221 and 223 are connected in a current mirror configuration where the gates of PFETs 221 and 223 are connected to the drain of PFET 221. In some embodiments, the mirror ratio of the current mirror of PFETs 221 and 223 is 1:1, but may be of other ratios in other embodiments. The sources and back gate contacts of PFETs 221 and 223 are connected to supply voltage terminal VDD.

Output circuit 205 includes a PFET 231 that is in a current mirror configuration with PFET 211 where the gate of PFET 231 is connected to the gate and drain of PFET 211 and receives a signal indicative of the current of ICTAT. The source and back gate contact of PFET 231 are connected to the supply voltage terminal VDD. PFET 233 is configured in a current mirror configuration with PFET 221 wherein its gate is connected to the drain and gate of PFET 221 to receive a signal indicated of IPTAT. The source and back gate contact of PFET 233 are connected to the supply voltage terminal VDD. The drains of PFETs 231 and 233 are connected to together and connected to output node 235 and to a terminal of resistor 237. The other terminal of resistor 237 is connected to supply voltage terminal VSS.

Because PFETs 211 and 231 are in a current mirror configuration, a current of ICTAT*MC flows in current path 214 through PFET 231 where MC is the mirror ratio of the current mirror of PFETs 211 and 231. Because PFETs 221 and 233 are in a current mirror configuration, a current of IPTAT*MP flows in current path 216 through PFET 233 where MP is the mirror ratio of the current mirror of PFETs 221 and 233. A combined current of (ICTAT*MC)+(IPTAT*MP) flows through resistor 237 where node 235 provides a reference voltage that is the voltage drop across resistor 237. Each of combined current (ICTAT*MC)+(IPTAT*MP) and voltage VREF have both a CTAT component and a PTAT component, where the combined current and reference voltage are relatively constant over a wide temperature range.

During operation, the current IP in path 220 of PTAT circuit 207 is mirrored by the current mirror of NFETs 225 and 226 to produce current IPTAT in path 218, where resistor 227 provides negative feedback to set the current values. Current IPTAT is mirrored by the current mirror of PFETs 223 and 221 such that current IP is a mirror of current IPTAT in the closed loop arrangement.

Where the mirror ratio of the current mirror of PFET 223 and PFET 221 is 1:1, current IPTAT can be defined as:

$$IPTAT = \frac{KBB * VTH0226}{R227(1+KBB)} + \sqrt{\frac{2 IPTAT}{\mu C\left(\frac{W226}{L226}\right)R227^2}} \times \left(1 - \frac{\sqrt{M}}{1+KBB}\right); \quad \text{EQ. 1}$$

Where:
  KBB is the back gate factor of NFETs 225 and 226. The back gate factor (KBB) of a transistor is equal the threshold voltage of the transistor when its back gate-to-source voltage is zero (VTH0) divided by the back gate-to-source voltage of the transistor when the effective threshold voltage of the transistor is 0V (VBSTH=0), or KBB=(VTH0)/(VBSTH=0);
  VTH0226 is the threshold voltage NFET 226;
  R227 is the resistance of resistor 227;
  μ is the electron mobility for NFETs 225 and 226;
  C is the capacitance for NFETs 225 and 226;
  W226 is the width of NFET 226;
  L226 is the length of NFET 226; and $$M \text{ is } \frac{\text{Width of } NFET226}{\text{Length of } NFET226} \times \frac{\text{Lenght of } NFET225}{\text{Width of } NFET225}.$$

From the equation above, current IPTAT has a CTAT component $$\left(\frac{KBB*VTH0226}{R227(1+KBB)}\right)$$

and a PTAT component $$\left(\sqrt{\frac{2IPTAT}{\mu C\left(\frac{W226}{L226}\right)R227^2}} \times \left(1 - \frac{\sqrt{M}}{1+KBB}\right)\right).$$

The PTAT component of current PTAT is due to electron mobility u being inversely proportional to temperature.

With circuit 207, the CTAT component is minimized by not connecting together the gate and back gate contact of NFET 225. Accordingly, the dominant factor in current IPTAT is the PTAT component where the current increases or decreases proportionally with a change in temperature.

During operation, the current IC in path 210 of CTAT circuit 203 is mirrored by the current mirror of NFETs 213 and 215 to produce current ICTAT in path 212 where resistor 217 provides a negative feedback to set the current values. Current ICTAT is mirrored by the current mirror of PFETs 209 and 211 such that current IC is a mirror of current ICTAT in the closed loop arrangement.

Where the mirror ratio of the current mirror of PFET 209 and PFET 211 is 1:1, current ICTAT can be defined as:

$$ICTAT = \frac{KBB*VTH0213}{R217(1+KBB)} + \sqrt{\frac{2ICTAT}{\mu C\left(\frac{W213}{L213}\right)R217^2}} \times \left(1 - \frac{\sqrt{M}}{1+KBB}\right); \quad \text{EQ. 2}$$

Where:
KBB is the back gate factor of NFETs 213 and 215;
VTH0213 is the threshold voltage NFET 213;
R217 is the resistance of resistor 217;
μ is the electron mobility for NFETs 213 and 215;
C is the capacitance for NFETs 213 and 215;
W213 is the width of NFET 213;
L213 is the length of NFET 213; and
M is $$\frac{\text{Width of } NFET213}{\text{Length of } NFET\,213} \times \frac{\text{Lenght of } NFET\,215}{\text{Width of } NFET\,215}.$$

From the equation above, current ICTAT has a CTAT component $$\frac{KBB*VTH0213}{R217(1+KBB)}$$

and a PTAT component $$\sqrt{\frac{2IC}{\mu C\left(\frac{W213}{L213}\right)R217^2}} \times \left(1 - \frac{\sqrt{M}}{1+KBB}\right).$$

As will be described below, for some embodiments of FIG. 2, the PTAT component of ICTAT is minimized by setting $$\frac{\text{Width of } NFET213}{\text{Length of } NFET\,213} \times \frac{\text{Lenght of } NFET\,215}{\text{Width of } NFET\,215} = (1+KBB)^2.$$

Although in some embodiments, process considerations and variances may prevent the above ratios of the precise lengths and widths of NFETs 213 and 215 from being exactly equal to $(1+KBB)^2$, the actual lengths and widths of NFETs 213 and 215 may be of a size such that $$\frac{\text{Width of } NFET213}{\text{Length of } NFET\,213} \times \frac{\text{Lenght of } NFET\,215}{\text{Width of } NFET\,215}$$

is within 2% or less of $(1+KBB)^2$ where current ICTAT still remains net CTAT. However, such variations may cause second order effects which may affect the flatness of the reference current or volage over temperature.

Because the back gate contact of NFET 215 is connected to its gate and to the drain and gate of NFET 213, the gate voltage and back gate contact voltage of NFET 215 is set to the gate-source voltage (VGS) of NFET 213 (VGS213).

The VGS of NFET 213 and NFET 215 can each be defined by $$VGS = VTH0 + \sqrt{\frac{2I}{\mu C \frac{W}{L}}}$$

where I is the current through the NFET, W is the width of the NFET, and L is the length of the NFET. Regarding the VGS of an NFET, VTH0 is CTAT and $$\sqrt{\frac{2I}{\mu C \frac{W}{L}}}$$

is PTAT.

With ICTAT=(VGS213−VGS215)/R217, the equation for ICTAT can be written as:

$$I_{CTAT} = \frac{\left\{VTH0213 + \sqrt{\frac{2I}{\mu_n C\left(\frac{W}{L}\right)_{213}}} - VTH0215 - \sqrt{\frac{2I}{\mu_n C\left(\frac{W}{L}\right)_{215}}}\right\}}{R217}; \quad \text{EQ. 3}$$

Since VTH0215=VTH0213−(KBB*(back gate-to-source voltage of NFET 215)) due to the gate and back gate contact of NFET 215 being connected to the gate and the drain of NFET 213, ICTAT can be written as:

$$ICTAT = \frac{\left\{V_{TH0213} + \sqrt{\frac{2I}{\mu_n C\left(\frac{W}{L}\right)_{213}}} - \frac{1}{(1+kbb)} * \left[V_{TH0213} + \sqrt{\frac{2I}{\mu_n C\left(\frac{W}{L}\right)_{215}}}\right]\right\}}{R217};$$  EQ. 4

By sizing NFET 213 and NFET 215 such that $$\frac{\text{Width of } NFET213}{\text{Length of } NFET213} \times \frac{\text{Lenght of } NFET215}{\text{Width of } NFET215} = (1+KBB)^2,$$

the PTAT component of the VGS of NFET 213 (VGS213) cancels out the PTAT component of the VGS of NFET 215 (VGS215).

Because the PTAT component of VGS213 cancels out the PTAT component of the VGS215, current ICTAT can be approximated to $$\frac{KBB*VTH0213}{R217(KBB+1)}$$

where the threshold voltage VTH0213 of NFET 213 is CTAT, thereby making current ICTAT, CTAT dominant.

Output circuit 205 combines ICTAT and IPTAT at selected ratios of MC and MP, respectively, to generate a current (ICTAT*MC)+(IPTAT*MP) that is relatively temperature independent. MC is determined by the width-to-length ratio of PFET 231 divided by the width-to length-ratio of PFET 211, and MP is determined by the width-to-length ratio of PFET 233 divided by the width-to-length ratio of PFET 221.

The voltage at node 235 can be expressed as VREF= ((ICTAT*MC)+(IPTAT*MP))*R237, where R327 is the resistance of resistor 237. VREF is relatively temperature independent in that current (ICTAT*MC)+(IPTAT*MP) is relatively temperature independent.

Under conditions described above, VREF can also be expressed as:

$$VREF = \left(MC \times \frac{R327xKBBxVTH0213}{R217x(1+KBB)}\right) + \left(MP \times \frac{2R327}{\mu C\left(\frac{W226}{L226}\right)R227^2}\right)x((1-\sqrt{M})^2);$$  EQ. 5

Where M is $$\frac{\text{Width of } NFET226}{\text{Length of } NFET226} \times \frac{\text{Lenght of } NFET225}{\text{Width of } NFET225};$$

The slopes of ICTAT and IPTAT can be independently adjusted or trimmed to make VREF as constant as possible over a wide range of temperatures. MC and MP can be adjusted for coarse slope trimming and R217 and R227 can be adjusted for fine slope trimming. The overall voltage of VREF can be adjusted by trimming R237. In some embodiments, MC, MP, R217, R227, and/or R237 can be made adjustable so as to be trimmed after manufacturing.

In one embodiment of FIG. 2 where VREF is designed to equal 1V, current ICTAT is set at 1 µA at 50 C, the mirror ratio of PFET 209 to PFET 211 is 1:1, the width-to-length ratio of NFET 215 is 1:2, the width-to-length ratio of NFET 213 is (1+KBB)²:2 or 1.3456:2, R217 is 65K ohms, the voltage at the source of NFET 215 is set at 63.2 mV at 50 C, IPTAT is set at 1 µA at 50 C, the mirror ratio for PFET 221 to PFET 223 is 1:1, the width-to-length ratio of NFET 225 is 4:2, the width-to-length ratio of NFET 226 is 1:2, R227 is 75K ohms, the voltage at the source of NFET 225 is set at 85.5 mV at 50 C, MC is 1.012, MP is 0.361, R237 is 706.8K ohms, VDD is 1.8 V, and VSS is 0V. In one simulation of the above parameter values for the circuit of FIG. 2, VREF was within a voltage range of 0.99985V to 1.0008V over a temperature range of −40 C to 150 C. However, the values for the parameters listed above may be different in other embodiments. In other embodiments, a circuit similar to FIG. 2 can be designed where the voltage (VREF) or current (ICTAT*MC)+(IPTAT*MP) will vary less than 0.2 percent over a range of 190 C (e.g., from −40 to 150 C). However, other reference value variances over other temperature ranges may be possible in other embodiments.

Figure 3:
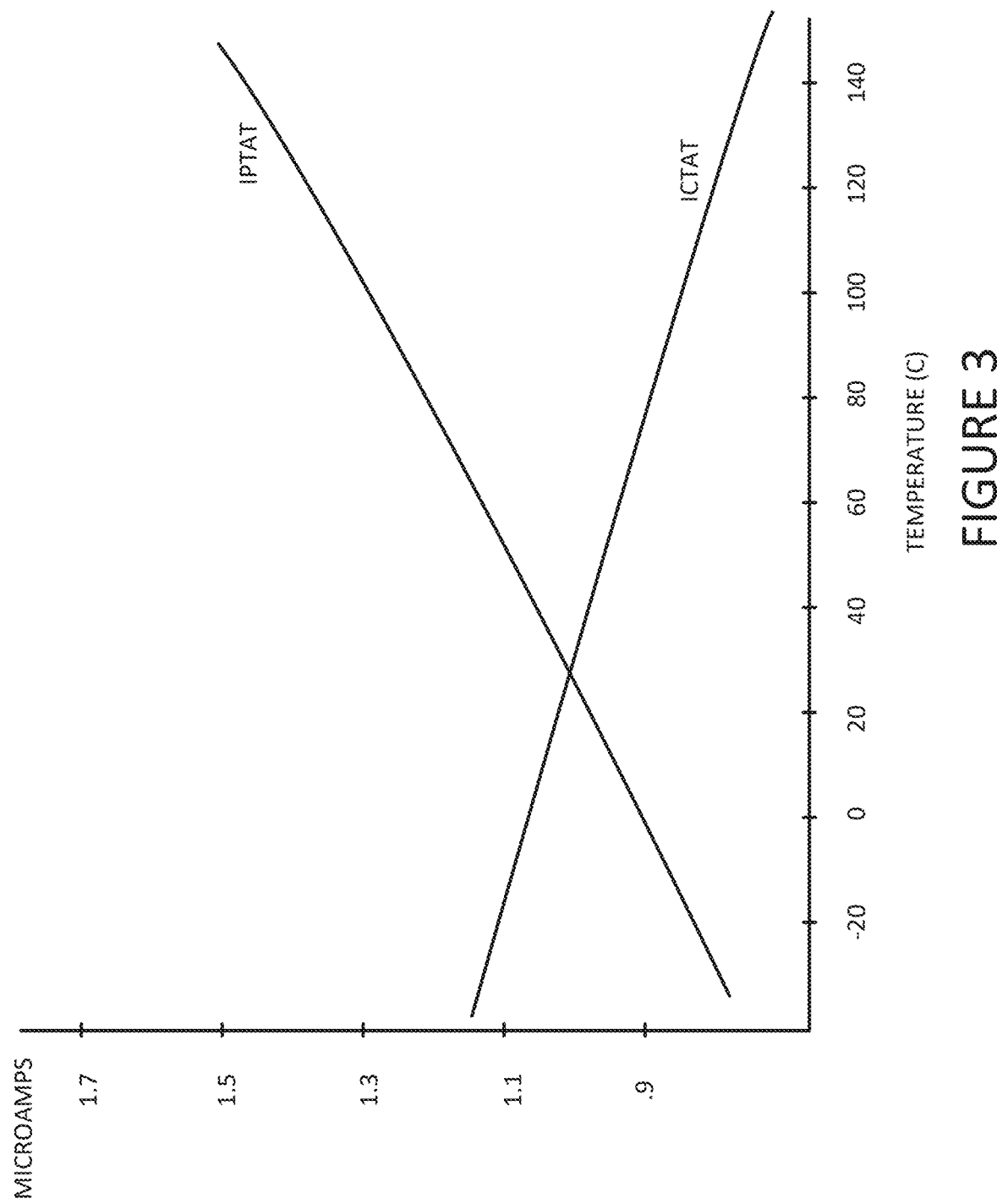
FIG. 3 is a graph of a PTAT current and a CTAT current produced by an embodiment of a reference voltage generator circuit according to one embodiment of the present invention.

FIG. 3 is a graph showing current IPTAT and current ICTAT over a temperature range of approximately −40 C to 150 C. As shown in FIG. 3, current IPTAT is PTAT (the current changes proportionally to changes in temperature) and current ICTAT is CTAT (the current changes complementarily to changes in temperature). As shown in FIG. 3, the slopes of IPTAT and ICTAT do not have the same magnitude where IPTAT has a slope with a greater magnitude. However, the mirror ratios MC and MP can be set to provide relatively equal slopes for ICTAT*MC and IPTAT*MP in order to provide for a relatively stable combined current over a wide range of temperatures.

In other embodiments, CTAT circuit 203, PTAT circuit of 207, and/or output circuit 205 of FIG. 2 may have other configurations, include other devices, and/or operate in other ways. For example, the current paths 210, 212, 218, and 220 may include a resistor between the NFET and the PFET of the current path. Also, the back gate contact of NFET 225 may be connected to supply terminal VSS.

Figure 4:
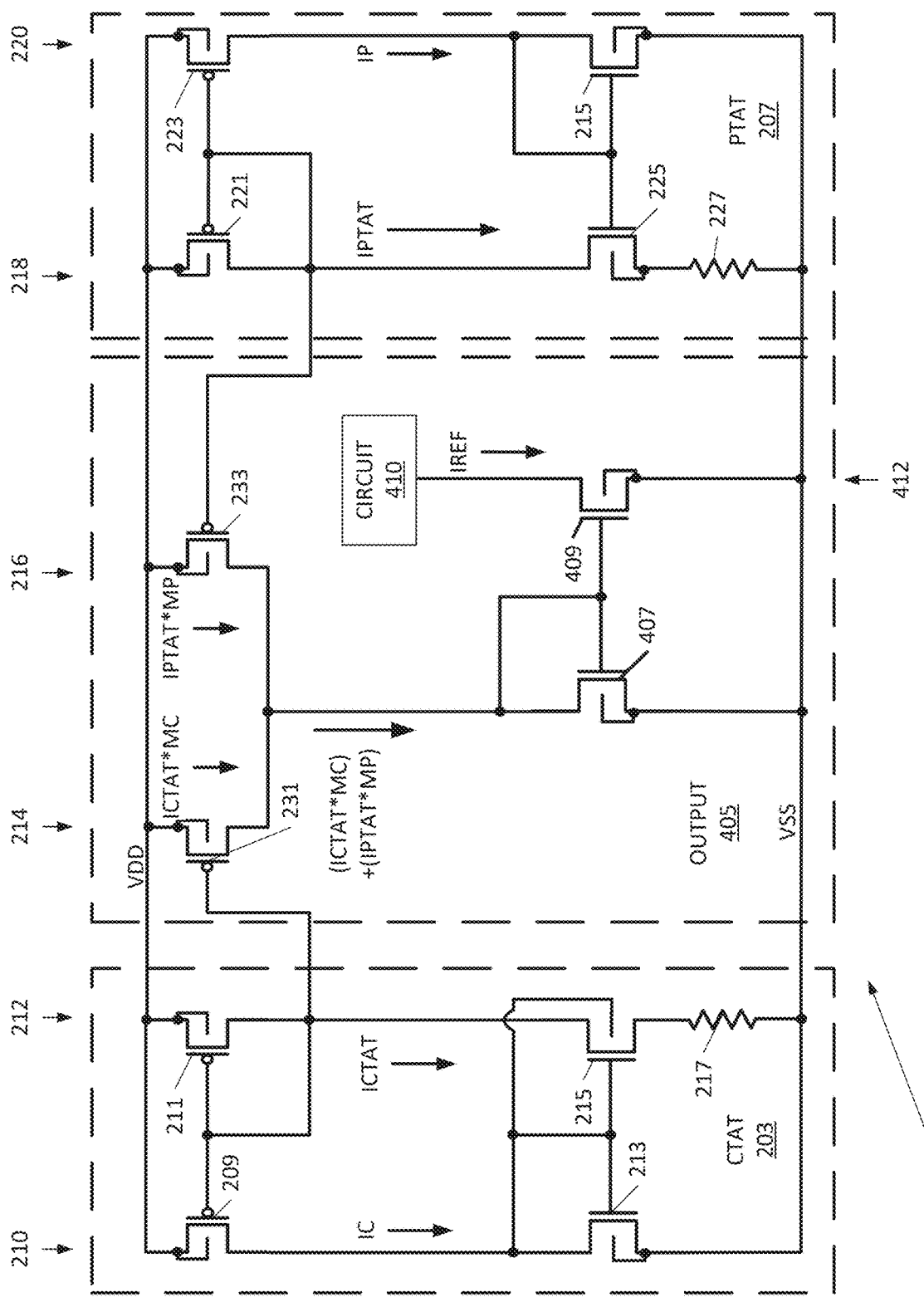
FIG. 4 is a reference current generator circuit according to one embodiment of the present invention.

FIG. 4 is a circuit diagram of a reference circuit 401 according to another embodiment. In the embodiment of FIG. 4, reference circuit 401 provides a reference current IREF that is relatively stable over temperature. The items with the same reference numbers in FIG. 4 as in FIG. 2 preform relatively the same functions.

Output circuit 405 is different from output circuit 205 in FIG. 2 in that it includes a current mirror of NFETs 407 and 409 to provide a reference current IREF at the drain of NFET 409 to a circuit 410 for use in the circuit. NFET 407 receives at its drain the combined current (ICTAT*MC)+ (IPTAT*MP). The drain of NFET 407 is connected to the gates of NFETs 407 and 409. The back gates and sources of NFETS 407 and 409 are connected to the supply voltage terminal VSS. The overall current value of IREF can be trimmed by adjusting the mirror ratio of the current mirror of NFET 407 and NFET 409. However, circuit 401 can have other configurations and/or be made of other devices in other embodiments.

Figure 5:
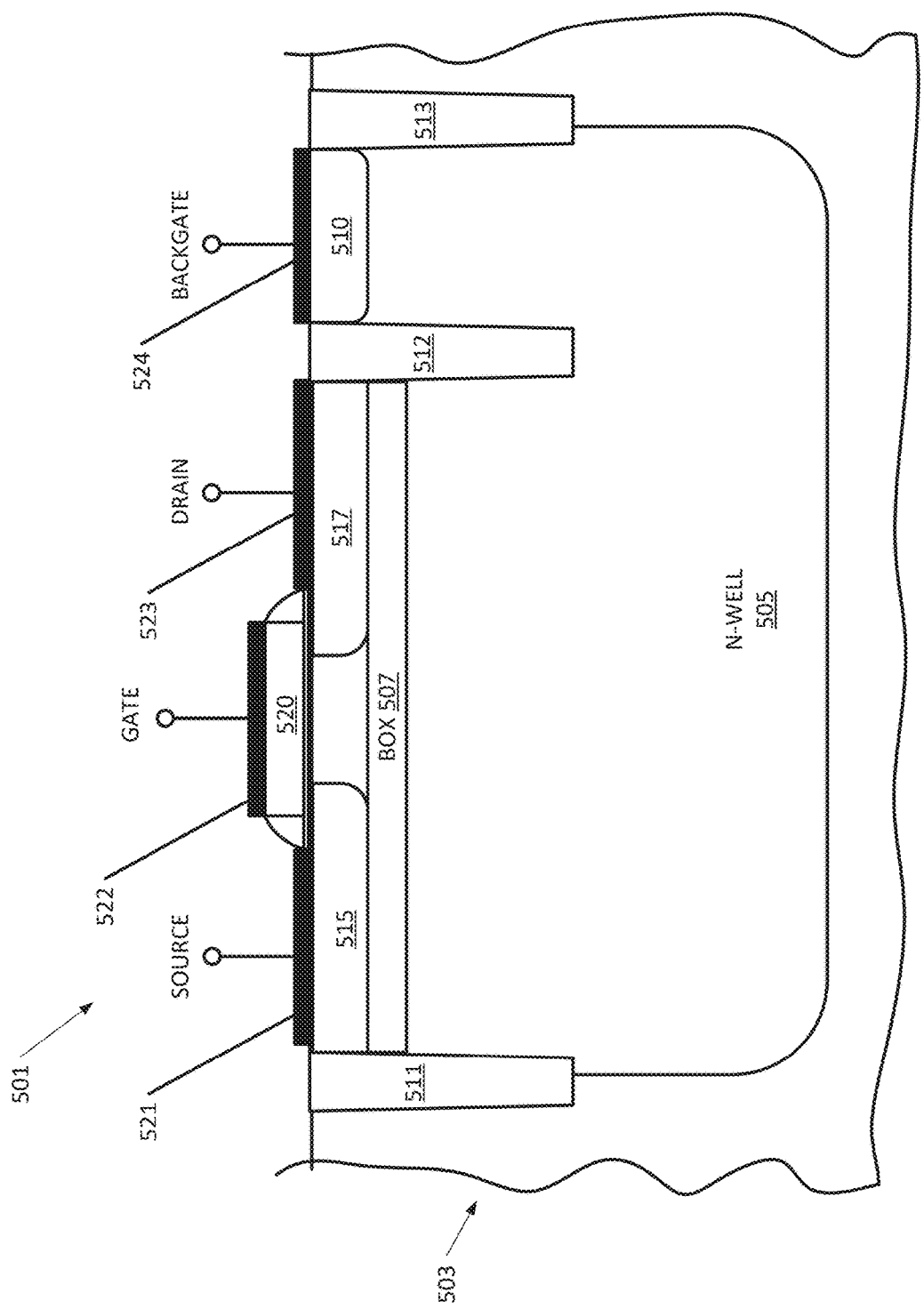
FIG. 5 is a cutaway side view of a fully depleted SOI NFET transistor according to one embodiment of the present invention.

FIG. 5 is a partial cutaway side view of an integrated circuit 501 showing a fully depleted SOI NFET. The transistor includes a source region 515, a drain region 517, and a channel region located laterally between source region 515 and drain region 517 in a semiconductor layer located above a buried oxide layer (BOX 507) in substrate 503. The source region 515 and drain region 517 are doped with N-type dopants. Gate 520 is located over a gate dielectric on substrate 503. The buried oxide layer 507 is located over a portion of a well of N-type dopants (N-WELL 505) wherein a portion of N-WELL 505 located under gate 520 serves as the back gate for the transistor. N-WELL 505 is biased by a back gate contact 524 that contacts an N-type contact region 510. Region 510 is laterally isolated by dielectric trench structures 512 and 513. Dielectric trench structure 511 laterally isolates a side of source region 515. Source contact 521, gate contact 522, and drain contact 523 are located on and used to bias source region 515, gate 521, and drain region 517, respectively. In one embodiment contacts 521-524 are made of a metal silicide, but made be made of other conductive material in other embodiments. In some embodiments, contact 524 may serve as the back gate contact for more than one transistor. In other embodiments a fully depleted SOI transistor may have other configurations. For example, the source regions and the drain regions may be raised. In some embodiments, a reference circuit using FDSOI transistors may be more accurate that a reference circuit using bipolar transistors. In other embodiments, other types of SOI transistors may be used.

Embodiments of reference circuits 201 or 401 may be used in a number of circuits and systems such as e.g., oscillators, digital logic, analog circuits, memories, serial interfaces, data converters, computational hardware, sensors, ADCs, DACs, or other types of circuits where a reference voltage or reference current is needed.

As described herein, proving a circuit having a current mirror of a pair of SOI transistors where the gate and back gate contact of one SOI transistor is connected to the gate and drain of the other SOI transistor, may in some embodiments, provide for a current generation circuit that can generate a current with a CTAT component. In some embodiments, such a circuit can be implemented without using bipolar transistors or special gate or gate dielectric materials for specific transistors of the integrated circuit.

Features described herein with respect to one embodiment may be implemented in other embodiments described herein. A source or a drain is a current terminal for a FET (field effect transistor). A gate is a control terminal for a FET. Two devices can be "coupled" to each other either through a current path with other devices or by being connected to each other. For example, referring to FIG. 2, the top terminal of resistor 217 (relative to the view of FIG. 2) is coupled to the drain of PFET 211 through the current path of NFET 215. The top terminal of resistor 217 is also coupled to the source of NFET 215 by being connected to the drain of NFET 215.

In one embodiment, a circuit includes a CTAT circuit including: a first SOI transistor of a first conductivity type; a second SOI transistor of the first conductivity type, wherein the first SOI transistor and the second SOI transistor are configured in a current mirror configuration, wherein a back gate contact of the first SOI transistor is connected to a gate of the first SOI transistor, a gate of the second SOI transistor, and a drain of the second SOI transistor; a third SOI transistor of a second conductivity type opposite the first conductivity type, wherein a drain of the first SOI transistor is coupled to a drain of the third SOI transistor in a first current path; a fourth SOI transistor of the second conductivity type, the fourth SOI transistor being in a current mirror configuration with the third SOI transistor, wherein the drain of the second SOI transistor is coupled to a drain of the fourth SOI transistor in a second current path; a resistive circuit located in the first current path, the resistive circuit including a first terminal coupled to a source of the first SOI transistor and a second terminal coupled to a supply voltage terminal; wherein during operation, the first current path carries a CTAT current.

In a further embodiment, the first SOI transistor has width (W1) and a length (L1) and the second SOI transistor has a width (W2) and a length (L2), and the first SOI transistor has a back gate factor (KBB); and (W2/L2)*(L1/W2) is within two percent of $(1+KBB)^2$.

In a further embodiment, the first SOI transistor, the second SOI transistor, the third SOI transistor and the fourth SOI transistor are characterized as fully depleted SOI transistors.

In a further embodiment, the circuit includes a PTAT circuit for producing a PTAT current; a combiner circuit, wherein during operation, the combiner circuit produces a combined current that flows through a third current path that is combination of a first current proportional to the CTAT current and a second current proportional to the PTAT current.

In a further embodiment, the third current path includes a node that provides a reference voltage whose voltage value is dependent upon the combined current.

In a further embodiment, the PTAT circuit includes a fifth SOI transistor of the first conductivity type; a sixth SOI transistor of the first conductivity type, wherein the fifth SOI transistor and the sixth SOI transistor are configured in a current mirror configuration; a seventh SOI transistor of the second conductivity type, wherein a drain of the fifth SOI transistor is coupled to a drain of the seventh SOI transistor in a fourth current path; an eighth SOI transistor of the second conductivity type, the eighth SOI transistor being in a current mirror configuration with the seventh SOI transistor, wherein the drain of the sixth SOI transistor (226) is coupled to a drain of the eighth SOI transistor in a fifth current path; a second resistive circuit located in the fourth current path, the second resistive circuit including a first terminal coupled to a source of the fifth SOI transistor and a second terminal coupled to the supply voltage terminal; wherein during operation, the fourth current path carries the PTAT current.

In a further embodiment, the circuit includes a ninth SOI transistor of the second conductivity type that includes gate coupled to the first current path, the ninth SOI transistor includes a drain coupled to the third current path, wherein the ninth SOI transistor and the third SOI transistor are configured in a current mirror configuration; a tenth SOI transistor of the second conductivity type that includes a gate coupled to the fourth current path, the tenth SOI transistor includes a drain coupled to the third current path, wherein the tenth SOI transistor and the seventh SOI transistor are configured in a current mirror configuration.

In a further embodiment, a back gate contact of the fifth SOI transistor is coupled to its source.

In a further embodiment, the combiner circuit includes a fifth SOI transistor of the second conductivity type that is configured to provide a current that is a mirror of the CTAT current, the fifth SOI transistor includes a drain coupled to the third current path; a sixth SOI transistor of the second conductivity type that is configured to provide a current that is a mirror of the PTAT current, the sixth SOI transistor includes a drain coupled to the third current path.

In a further embodiment, the third current path includes fifth SOI transistor, wherein the fifth SOI transistor and a sixth SOI transistor located in a fourth current path are configured in a current mirror configuration, wherein during operation, the fourth current path provides a reference current that is a mirror of the combined current.

In a further embodiment, the combined current is relative constant within 0.2 percent over a temperature range of at least 190 C.

In a further embodiment, a back gate contact of the second SOI transistor is coupled to its source.

In a further embodiment, the first SOI transistor and the second SOI transistor are characterized as NFETs and the third SOI transistor and the fourth SOI transistor are characterized as PFETs.

In another embodiment, a method includes producing a first current in a first current path; producing a CTAT current in a second current path wherein the CTAT current is a mirror current of the first current; wherein the first current path includes a first SOI transistor; wherein the second current path includes a second SOI transistor including a gate and a back gate contact that is connected to a gate and drain of the first SOI transistor.

In a further embodiment, the first SOI transistor has width (W1) and a length (L1) and the second SOI transistor has a width (W2) and a length (L2), and the first SOI transistor has a back gate factor (KBB); and (W1/L1)*(L2/W2) is within two percent of $(1+KBB)^2$.

In a further embodiment, the method includes producing an PTAT current; combining a second current that is a mirror current of the CTAT current; combining the second current and the PTAT current to produce a combined current in a third current path.

In a further embodiment, the method includes using the combined current to produce a reference voltage that is dependent upon the CTAT current and PTAT current.

In a further embodiment, the combined current is relatively constant within .2 percent over a temperature and of at least 190 C.

In a further embodiment, the method includes using the combined current to produce a reference current; and using the reference current by a circuit during its operation.

In another embodiment, a circuit includes a CTAT circuit includes a first SOI transistor of a first conductivity type in a first current path; a second SOI transistor of the first conductivity type in a second current path, wherein the first SOI transistor and the second SOI transistor are configured in a current mirror configuration, wherein a back gate contact of the first SOI transistor is connected to a gate of the first SOI transistor, a gate of the second SOI transistor, and a drain of the second SOI transistor; a resistive circuit located in the first current path, the resistive circuit including a first terminal coupled to a source of the first SOI transistor and a second terminal coupled to a supply voltage terminal; wherein during operation, the first current path carries a CTAT current; a PTAT circuit for producing a PTAT current; a combiner circuit, wherein during operation, the combiner circuit produces a combined current that flows through a third current path that is combination of a first current proportional to the CTAT current and a second current proportional to the PTAT current.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
   a CTAT circuit including:
      a first SOI transistor of a first conductivity type;
      a second SOI transistor of the first conductivity type, wherein the first SOI transistor and the second SOI transistor are configured in a current mirror configuration, wherein a back gate contact of the first SOI transistor is connected to a gate of the first SOI transistor, a gate of the second SOI transistor, and a drain of the second SOI transistor;
      a third SOI transistor of a second conductivity type opposite the first conductivity type, wherein a drain of the first SOI transistor is coupled to a drain of the third SOI transistor in a first current path;
      a fourth SOI transistor of the second conductivity type, the fourth SOI transistor being in a current mirror configuration with the third SOI transistor, wherein the drain of the second SOI transistor is coupled to a drain of the fourth SOI transistor in a second current path;
      a resistive circuit located in the first current path, the resistive circuit including a first terminal coupled to a source of the first SOI transistor and a second terminal coupled to a supply voltage terminal;
      wherein during operation, the first current path carries a CTAT current.

2. The circuit of claim 1 wherein:
   The first SOI transistor has width (W1) and a length (L1) and the second SOI transistor has a width (W2) and a length (L2), and the first SOI transistor has a back gate factor (KBB);
   (W2/L2)*(L1/W2) is within two percent of $(1+KBB)^2$.

3. The circuit of claim 1 wherein the first SOI transistor, the second SOI transistor, the third SOI transistor and the fourth SOI transistor are characterized as fully depleted SOI transistors.

4. The circuit of claim 1 further comprising:
   a PTAT circuit for producing a PTAT current;
   a combiner circuit, wherein during operation, the combiner circuit produces a combined current that flows through a third current path that is combination of a first current proportional to the CTAT current and a second current proportional to the PTAT current.

5. The circuit of claim 4 wherein the third current path includes a node that provides a reference voltage whose voltage value is dependent upon the combined current.

6. The circuit of claim 4 wherein the PTAT circuit includes:
   a fifth SOI transistor of the first conductivity type;
   a sixth SOI transistor of the first conductivity type, wherein the fifth SOI transistor and the sixth SOI transistor are configured in a current mirror configuration;
   a seventh SOI transistor of the second conductivity type, wherein a drain of the fifth SOI transistor is coupled to a drain of the seventh SOI transistor in a fourth current path;
   an eighth SOI transistor of the second conductivity type, the eighth SOI transistor being in a current mirror configuration with the seventh SOI transistor, wherein the drain of the sixth SOI transistor (226) is coupled to a drain of the eighth SOI transistor in a fifth current path;

a second resistive circuit located in the fourth current path, the second resistive circuit including a first terminal coupled to a source of the fifth SOI transistor and a second terminal coupled to the supply voltage terminal;

wherein during operation, the fourth current path carries the PTAT current.

7. The circuit of claim 6 further comprising:

a ninth SOI transistor of the second conductivity type that includes gate coupled to the first current path, the ninth SOI transistor includes a drain coupled to the third current path, wherein the ninth SOI transistor and the third SOI transistor are configured in a current mirror configuration;

a tenth SOI transistor of the second conductivity type that includes a gate coupled to the fourth current path, the tenth SOI transistor includes a drain coupled to the third current path, wherein the tenth SOI transistor and the seventh SOI transistor are configured in a current mirror configuration.

8. The circuit of claim 6 wherein a back gate contact of the fifth SOI transistor is coupled to its source.

9. The circuit of claim 4 wherein the combiner circuit includes:

a fifth SOI transistor of the second conductivity type that is configured to provide a current that is a mirror of the CTAT current, the fifth SOI transistor includes a drain coupled to the third current path;

a sixth SOI transistor of the second conductivity type that is configured to provide a current that is a mirror of the PTAT current, the sixth SOI transistor includes a drain coupled to the third current path.

10. The circuit of claim 4 wherein the third current path includes fifth SOI transistor, wherein the fifth SOI transistor and a sixth SOI transistor located in a fourth current path are configured in a current mirror configuration, wherein during operation, the fourth current path provides a reference current that is a mirror of the combined current.

11. The circuit of claim 4 wherein the combined current is relative constant within 0.2 percent over a temperature range of at least 190 C.

12. The circuit of claim 1 wherein a back gate contact of the second SOI transistor is coupled to its source.

13. The circuit of claim 1 wherein the first SOI transistor and the second SOI transistor are characterized as NFETs and the third SOI transistor and the fourth SOI transistor are characterized as PFETs.

14. A method comprising:

producing a first current in a first current path;

producing a CTAT current in a second current path wherein the CTAT current is a mirror current of the first current;

wherein the first current path includes a first SOI transistor;

wherein the second current path includes a second SOI transistor including a gate and a back gate contact that is connected to a gate and drain of the first SOI transistor.

15. The method of claim 14 wherein;

The first SOI transistor has width (W1) and a length (L1) and the second SOI transistor has a width (W2) and a length (L2), and the first SOI transistor has a back gate factor (KBB);

$(W1/L1)*(L2/W2)$ is within two percent of $(1+KBB)^2$.

16. The method of claim 14 further comprising;

producing an PTAT current;

combining a second current that is a mirror current of the CTAT current;

combining the second current and the PTAT current to produce a combined current in a third current path.

17. The method of claim 16, further comprising using the combined current to produce a reference voltage that is dependent upon the CTAT current and PTAT current.

18. The method of claim 16 wherein the combined current is relatively constant within 0.2 percent over a temperature and of at least 190 C.

19. The method of claim 14 further comprising:

using the combined current to produce a reference current;

using the reference current by a circuit during its operation.

20. A circuit comprising:

a CTAT circuit including:

a first SOI transistor of a first conductivity type in a first current path;

a second SOI transistor of the first conductivity type in a second current path, wherein the first SOI transistor and the second SOI transistor are configured in a current mirror configuration, wherein a back gate contact of the first SOI transistor is connected to a gate of the first SOI transistor, a gate of the second SOI transistor, and a drain of the second SOI transistor;

a resistive circuit located in the first current path, the resistive circuit including a first terminal coupled to a source of the first SOI transistor and a second terminal coupled to a supply voltage terminal;

wherein during operation, the first current path carries a CTAT current;

a PTAT circuit for producing a PTAT current;

a combiner circuit, wherein during operation, the combiner circuit produces a combined current that flows through a third current path that is combination of a first current proportional to the CTAT current and a second current proportional to the PTAT current.

* * * * *